(12) United States Patent
Jain et al.

(10) Patent No.: US 8,421,077 B2
(45) Date of Patent: Apr. 16, 2013

(54) REPLACEMENT GATE MOSFET WITH SELF-ALIGNED DIFFUSION CONTACT

(75) Inventors: Sameer H. Jain, Beacon, NY (US); Carl J. Radens, LaGrangeville, NY (US); Shahab Siddiqui, White Plains, NY (US); Jay W. Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 12/795,973

(22) Filed: Jun. 8, 2010

(65) Prior Publication Data

US 2011/0298017 A1 Dec. 8, 2011

(51) Int. Cl.
*H01L 29/10* (2006.01)
(52) U.S. Cl.
USPC ...... 257/57; 257/133; 257/192; 257/E21.051; 438/135; 438/197
(58) Field of Classification Search .......................... None
See application file for complete search history.

(56) References Cited

U.S. PATENT DOCUMENTS

2011/0156107 A1* 6/2011 Bohr et al. .................... 257/288

* cited by examiner

*Primary Examiner* — Tan N Tran
*Assistant Examiner* — Scott R Wilson
(74) *Attorney, Agent, or Firm* — Scully, Scott, Murphy & Presser, P.C.; H. Daniel Schnurmann

(57) ABSTRACT

A replacement gate field effect transistor includes at least one self-aligned contact that overlies a portion of a dielectric gate cap. A replacement gate stack is formed in a cavity formed by removal of a disposable gate stack. The replacement gate stack is subsequently recessed, and a dielectric gate cap having sidewalls that are vertically coincident with outer sidewalls of the gate spacer is formed by filling the recess over the replacement gate stack. An anisotropic etch removes the dielectric material of the planarization layer selective to the material of the dielectric gate cap, thereby forming at least one via cavity having sidewalls that coincide with a portion of the sidewalls of the gate spacer. A portion of each diffusion contact formed by filling the at least one via cavity overlies a portion of the gate spacer and protrudes into the dielectric gate cap.

20 Claims, 19 Drawing Sheets

REPLACEMENT GATE MOSFET WITH SELF-ALIGNED DIFFUSION CONTACT

BACKGROUND

The present invention relates to semiconductor structures, and particularly to a metal-oxide-semiconductor field effect transistor (MOSFET) having at least one self-aligned diffusion contact and methods of manufacturing the same.

As semiconductor devices shrink in each generation of semiconductor technology, formation of contact structures to source and drain regions of a field effect transistor become challenging because such contact structures not only need to provide reliable electrical contact to the source and drain regions, but also need to avoid electrically shorting to other components such as the gate electrode of the field effect transistor. Since the etch chemistry employed for the anisotropic etch process remains the same while the lateral dimension of the dielectric gate spacer shrinks with the scaling of semiconductor devices, the likelihood of excessive removal of the dielectric gate spacer within the normal range of process variations during the anisotropic etch increases as the dielectric gate spacer becomes thinner in each technology generation. Excessive removal of the dielectric gate spacer increases the probability of an electrical short between a contact to the source region or the drain region of a field effect transistor and the gate electrode of the field effect transistor. Thus, the possibility of excessively thinning the dielectric gate spacer during the anisotropic etch for forming contact vias is a significant concern for product yield and reliability purposes.

BRIEF SUMMARY

A replacement gate field effect transistor includes at least one self-aligned contact that overlies a portion of a dielectric gate cap. First, a disposable gate stack, a gate spacer, and a planarization layer are formed. Then, a replacement gate stack is formed in a cavity provided by removal of the disposable gate stack. The replacement gate stack is subsequently recessed, and a dielectric gate cap having sidewalls that are vertically coincident with outer sidewalls of the gate spacer is formed by filling the recess over the replacement gate stack. An anisotropic etch removes the dielectric material of the planarization layer selective to the material of the dielectric gate cap, thereby forming at least one via cavity having sidewalls that coincide with a portion of the sidewalls of the gate spacer. A portion of each diffusion contact formed by filling the at least one via cavity overlies a portion of the gate spacer and protrudes into the dielectric gate cap.

According to an aspect of the present invention, a semiconductor structure is provided, which includes: a field effect transistor including a gate stack, from bottom to top, of a gate dielectric and a gate conductor, wherein the gate stack is located on a surface of a semiconductor substrate; a dielectric gate spacer located on a surface of the gate dielectric; a dielectric gate cap located above the gate stack and contacting upper surfaces of the dielectric gate spacer; and a conductive via structure having a sidewall that contacts the dielectric gate spacer and the dielectric gate cap and including an upper conductive via portion that laterally protrudes above the sidewall of the conductive via structure and over a portion of the dielectric gate spacer.

According to another aspect of the present invention, a method of forming a semiconductor structure is provided, which includes forming a disposable material stack on a surface of the semiconductor substrate; forming a dielectric gate spacer on sidewalls of the disposable material stack; forming a dielectric material layer on the surface of the semiconductor substrate, wherein the dielectric gate spacer has inner vertical sidewalls and outer vertical sidewalls, each of which extends from the surface of the semiconductor substrate to a top surface of the dielectric material layer; forming a gate dielectric and a gate conductor on the semiconductor substrate by replacing the disposable material stack; forming a recessed space by recessing the gate conductor and the dielectric gate spacer; forming a dielectric gate cap by filling the recessed space, wherein a topmost surface of the dielectric gate cap is coplanar with a topmost surface of the dielectric material layer after planarization; anisotropically etching a portion of the dielectric material layer and an upper portion of the dielectric gate spacer, wherein a contiguous via cavity exposing a conductive structure underneath the dielectric material layer is formed, and the contiguous via cavity includes a laterally protruding portion that overlies a horizontal surface of the dielectric gate cap that is recessed relative to the topmost surface of the dielectric gate cap.

DETAILED DESCRIPTION

Figure 1:
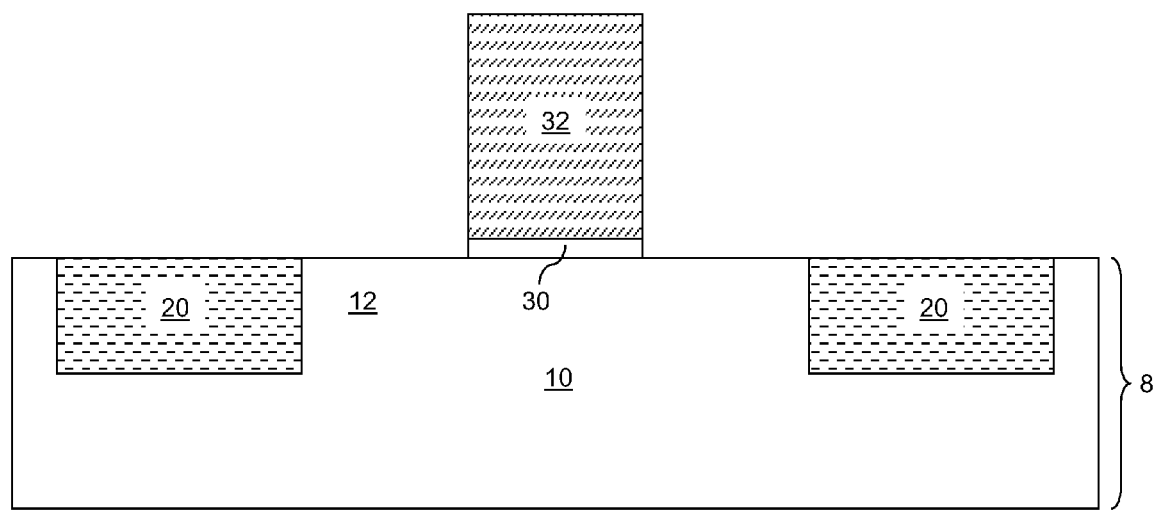
FIG. 1 is a vertical cross-sectional view of a first exemplary semiconductor structure after formation of a disposable gate stack according to a first embodiment of the present invention.

As stated above, the present invention relates to a metal-oxide-semiconductor field effect transistor (MOSFET) having at least one self-aligned diffusion contact and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to a first embodiment of the present invention includes a semiconductor substrate 8. The semiconductor substrate 8 includes a semiconductor layer 10 and isolation structures 20 embedded in the semiconductor layer 10. The isolation structures 20 include a dielectric material such as silicon oxide and/or silicon nitride. For example, the isolation structures 20 can be shallow trench isolation structures known in the art.

The semiconductor layer 10 is composed of a semiconductor material such as silicon, a silicon containing alloy, a germanium containing alloy, a III-V compound semiconductor, or a II-IV semiconductor. Preferably, the entirety of the semiconductor layer 10 is single crystalline. The semiconductor substrate 8 may be a bulk substrate, a semiconductor-on-insulator (SOI) substrate, or a hybrid substrate including a bulk portion and an SOI portion. If the semiconductor substrate 8 is an SOI substrate or a hybrid substrate, the semiconductor substrate 8 includes a buried insulator layer (not shown) or a buried insulator portion (not shown) that is located on a bottom surface of the isolation structures 20, and the semiconductor layer 10 may be vertically confined between the top surfaces and the bottom surfaces of the isolation structures 20. While the present invention is described with an SOI substrate, equivalent embodiments employing other types of substrates are also contemplated herein.

A disposable material stack is formed on the surface of the semiconductor substrate 10. The disposable material stack can include a disposable dielectric 30 and a disposable material portion 32. For example, the disposable dielectric 30 can include silicon oxide or another dielectric material that can be etched selective to the semiconductor material of the semiconductor layer 10. The thickness of the disposable dielectric 30 can be from 1 nm to 30 nm, and typically from 1 nm to 5 nm, although lesser and greater thicknesses can also be employed.

The disposable material portion 32 can include a material that can be etched selective to the material of a dielectric gate spacer to be subsequently formed. For example, the disposable material portion 32 can be composed of polysilicon or a silicon-containing semiconductor alloy such as a silicon-germanium alloy. Alternately, the disposable material portion 32 can include a dielectric material or a conductive material that can be etched selective to the material of a dielectric gate spacer to be subsequently formed. The thickness of the disposable material portion 32 can be from 50 nm to 500 nm, and typically from 80 nm to 250 nm, although lesser and greater thicknesses can also be employed.

The disposable material stack can be formed by depositing the materials of the disposable dielectric 30 and the disposable material portion 32 as blanket layers, and subsequently lithographically patterning the blanket layers so that remaining portions of the blanket layer constitute the disposable material stack located on a portion of the semiconductor layer 10 between two isolation structures 20. The sidewalls of the disposable dielectric 30 and the disposable material portion 32 are substantially vertical. Further, sidewalls of the disposable dielectric 30 and the disposable material portion 32 are vertically coincident, i.e., sidewalls of the disposable dielectric 30 coincide with sidewalls of the disposable material portion 32 in a top-down view.

Figure 2:
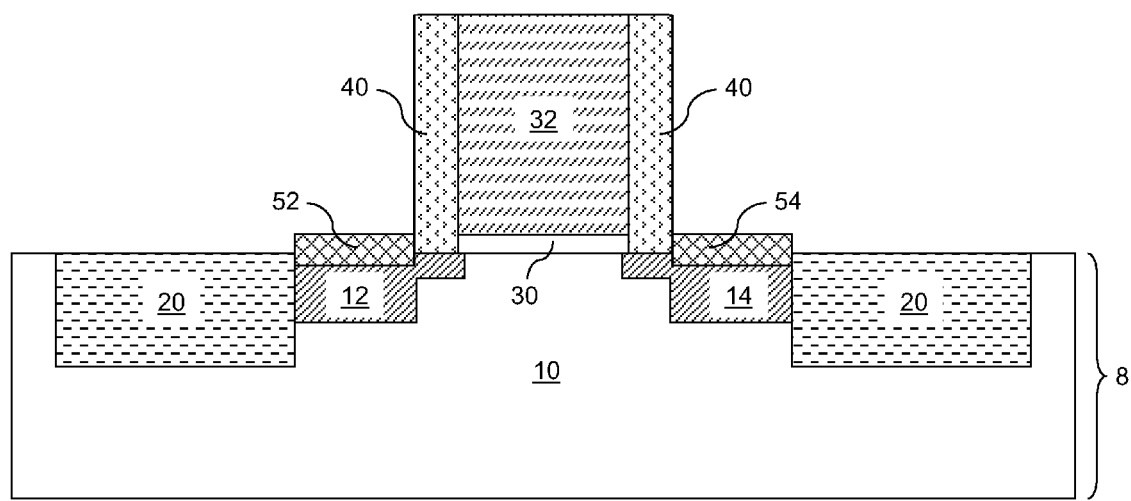
FIG. 2 is a vertical cross-sectional view of the first exemplary semiconductor structure after formation of a dielectric gate spacer, source and drain regions, and source-side and drain-side metal semiconductor alloy portions according to the first embodiment of the present invention.

Referring to FIG. 2, source and drain extension implantation is performed to form source and drain extension regions, which are laterally protruding portions of a source region 12 and a drain region 14 that contact the disposable dielectric 30. A dielectric gate spacer 40 is formed by depositing, and subsequently anisotropically etching, a conformal dielectric material layer. Horizontal portions of the conformal dielectric material layer are removed during the anisotropic etching, and remaining vertical portions of the conformal dielectric material layer after the anisotropic etching constitutes the dielectric gate spacer 40. The dielectric gate spacer 40 comprises a dielectric material such as silicon oxide, silicon nitride, and silicon oxynitride. The lateral thickness of the dielectric gate spacer 40 can be from 10 nm to 100 nm, although lesser and greater lateral thicknesses can also be employed. The inner sidewalls of the dielectric gate spacer 40, which contact the sidewalls of the disposable dielectric 30 and the disposable material portion 32, and outer sidewalls of the dielectric gate spacer 40 are vertical.

Deep source and drain implantation is performed to complete formation of the source region 12 and the drain region 14, which include the source and drain extension regions, respectively, at the end of the deep source and drain implantation. The source region 12 and the drain region 14 have a doping of the opposite conductivity type that the remaining portion of the semiconductor layer 10, which functions as a body region of a transistor. A source-side metal semiconductor alloy portion 52 and a drain-side metal semiconductor alloy portion 54 are formed by reacting a metal layer with the exposed portions of the source region 12 and the drain region 14 employing methods known in the art. Unreacted portions of the metal layer are removed after formation of the source-side metal semiconductor alloy portion 52 and the drain-side metal semiconductor alloy portion 54. The source-side metal semiconductor alloy portion 52 is a conductive structure located directly on the source region 12, and the drain-side metal semiconductor alloy portion 54 is a conductive structure located directly on the drain region 14. The source-side metal semiconductor alloy portion 52 and the drain-side metal semiconductor alloy portion 54 can be a metal silicide if the semiconductor material of the source region 12 and the drain region 14 include silicon.

Figure 3:
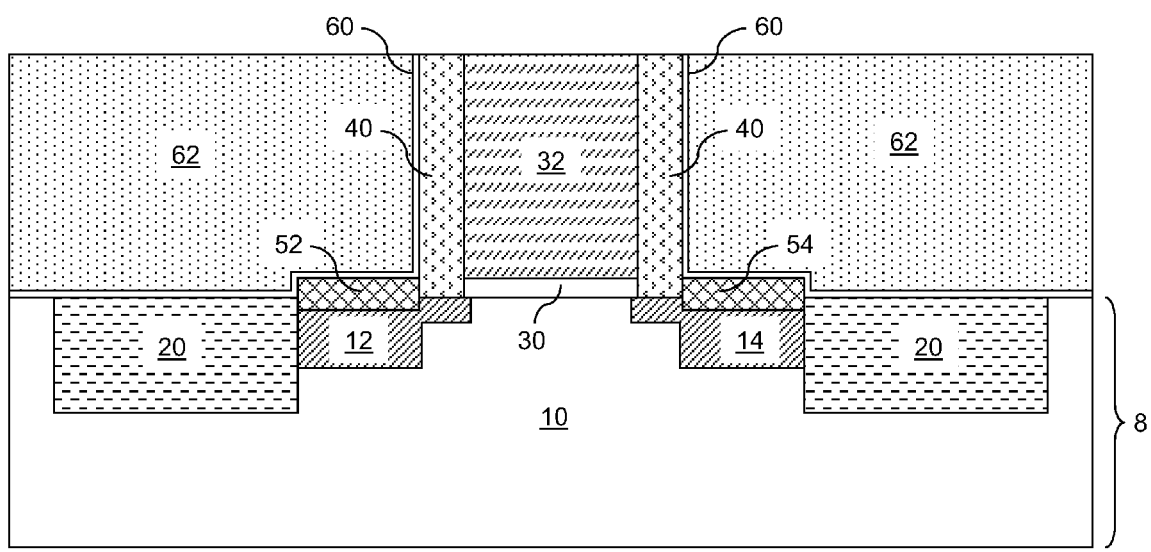
FIG. 3 is a vertical cross-sectional view of the first exemplary semiconductor structure after formation and planarization of a dielectric material layer according to the first embodiment of the present invention.

Referring to FIG. 3, an optional dielectric liner 60 is conformally deposited over the semiconductor substrate 8, the source-side and drain-side metal semiconductor alloy portions (52, 54), the dielectric gate spacer 40, and the disposable material portion 32. The optional dielectric liner 60 includes a dielectric material such as silicon oxide or silicon nitride. A dielectric material layer 62 is deposited over the optional dielectric liner 60, if present, or over the semiconductor substrate 8, the source-side and drain-side metal semiconductor alloy portions (52, 54), the dielectric gate spacer 40, and the disposable material portion 32. The dielectric material layer 62 includes a dielectric material such as undoped silicate glass, doped silicate glass, organosilicate glass (OSG), or a porous dielectric material. In one embodiment, the dielectric material layer 62 can include a porous or non-porous low dielectric constant (low-k) material having a dielectric constant less than 2.7. The dielectric material layer 62 is subsequently planarized so that the top surfaces of the disposable material portion 32, the dielectric gate spacer 40, and the dielectric material layer 62 are coplanar, i.e., located within the same horizontal plane. The portion of the optional dielectric liner 60, if employed, over the disposable material portion 32 and the dielectric gate spacer 40 are removed during the planarization process.

Because the outer sidewalls of the dielectric gate spacer 40 are vertical, the optional dielectric liner 40, if present, includes a vertical portion that contiguously extends to the top surface of the dielectric material layer 62. The dielectric gate spacer 40 has inner vertical sidewalls and outer vertical sidewalls, each of which extends from the top surface of the semiconductor substrate 8 to the top surface of the dielectric material layer 62.

Figure 4:
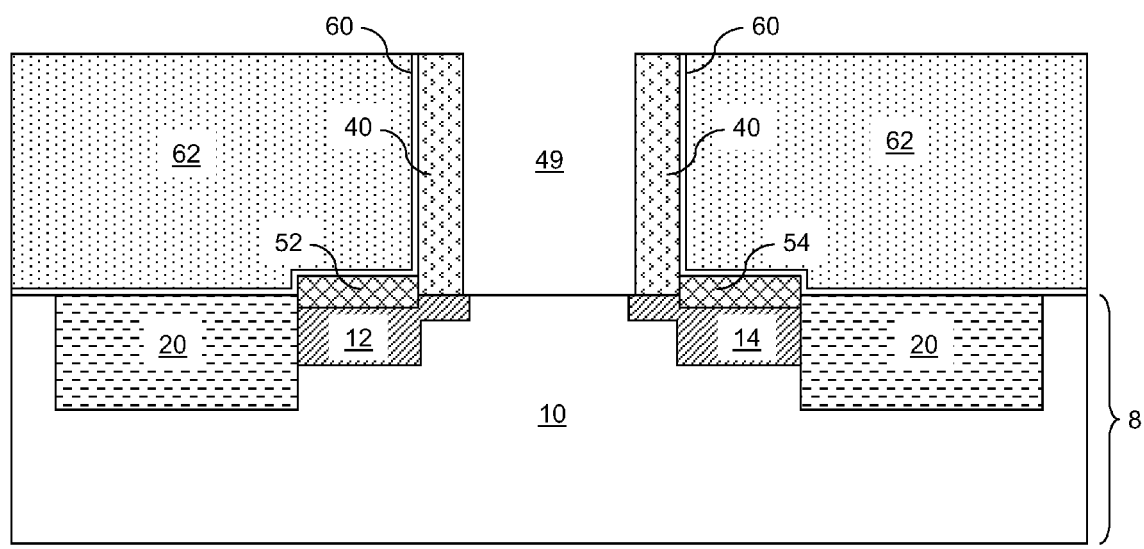
FIG. 4 is a vertical cross-sectional view of the first exemplary semiconductor structure after removal of the disposable gate stack according to the first embodiment of the present invention.

Referring to FIG. 4, the disposable gate stack including the disposable material portion 32 and the disposable dielectric 30 are removed selective to the dielectric gate spacer 40 and the dielectric material layer 62. The removal of the disposable gate stack (32, 30) can be effected, for example, by a first isotropic or anisotropic etch that removes the material of the disposable material portion 32 while not removing the materials of the dielectric gate spacer 40 and the dielectric material layer 62, followed by a second isotropic or anisotropic etch that removes the disposable dielectric 30 while not removing, or only marginally removing, the materials of the dielectric gate spacer 40 and the dielectric material layer 62. A vacant space 49 exposing a portion of the top surface of the semiconductor substrate 8 is formed after removal of the disposable material stack (32, 30). The vacant space 49 is laterally confined by the inner sidewalls of the dielectric gate spacer 40.

Figure 5:
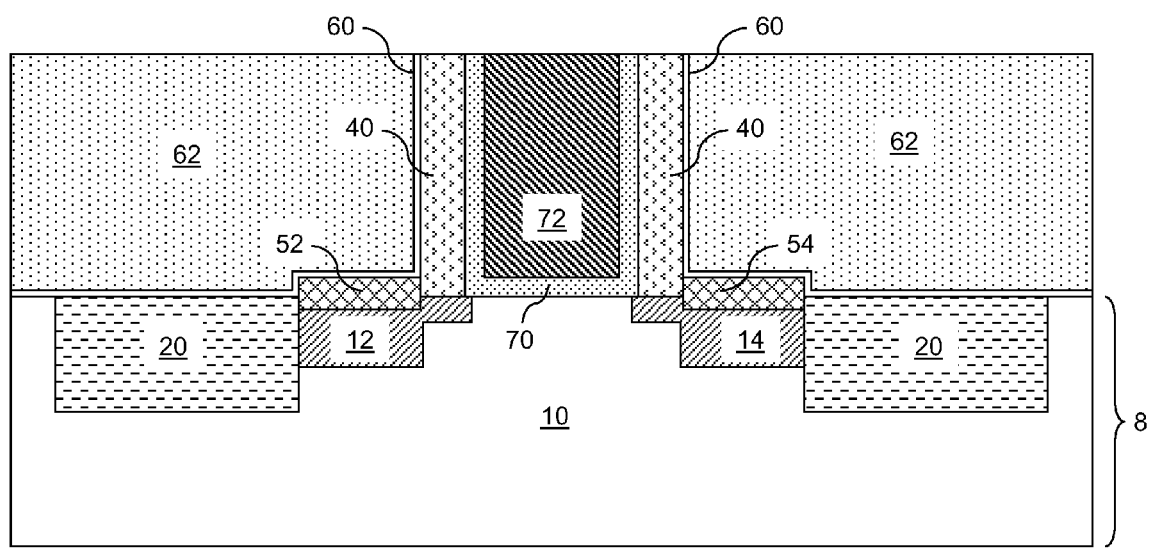
FIG. 5 is a vertical cross-sectional view of the first exemplary semiconductor structure after formation of a replacement gate stack according to the first embodiment of the present invention.

Referring to FIG. 5, a replacement gate stack is formed by filling the vacant space 49 with a gate dielectric 70 and a gate conductor 72. The gate dielectric 70 is formed directly on at least the exposed surface of the semiconductor layer 10.

In one embodiment, the gate dielectric 70 is formed by a conformal or non-conformal deposition of a dielectric material. The gate dielectric 70 is a U-shaped gate dielectric that contiguously extends from the top surface of the semiconductor substrate 8 to the top surface of the dielectric material layer 62. For example, the gate dielectric can be composed of a high dielectric constant (high-k) dielectric material including a dielectric metal oxide and having a dielectric constant greater than 4.0. The dielectric metal oxide is a high-k material including a metal and oxygen, and optionally nitrogen. For example, the high-k dielectric material may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

The high-k dielectric material may be formed by methods well known in the art including, for example, chemical vapor deposition (CVD), atomic layer deposition (ALD), molecular beam epitaxy (MBE), pulsed laser deposition (PLD), liquid source misted chemical deposition (LSMCD), etc. The thickness of the gate dielectric 70 in this embodiment can be from about 2 nm to about 6 nm, and may have an effective oxide thickness on the order of or less than 1 nm, although lesser and greater thicknesses can also be employed.

In another embodiment, the gate dielectric 70 is a dielectric material derived from conversion of a surface portion of the semiconductor layer 10 by oxidation, nitridation, or a combination thereof. For example, the gate dielectric 70 can be silicon oxide, silicon nitride, silicon oxynitride, or a combination thereof. In this embodiment, the gate dielectric 70 is a planar layer that is formed only on the exposed surface of the semiconductor layer 10. The thickness of the gate dielectric 70 in this embodiment can be from about 1 nm to about 6 nm, although lesser and greater thicknesses can also be employed.

The gate conductor 72 includes a conductive material such at least one metal layer, at least one doped semiconductor layer, or a combination thereof. If a metal layer is employed within the gate conductor 72, the metal layer can be formed directly on the high dielectric constant material layer, for example, by chemical vapor deposition (CVD), physical vapor deposition (PVD), atomic layer deposition (ALD), etc. The metal layer comprises a conductive metallic material which may be a metal, a metal alloy, or a metallic nitride. For example, the metal layer may comprise a material such as TaN, TiN, WN, TiAlN, TaCN, other conductive refractory metallic nitrides, or an alloy thereof. The conductive metallic material is also known as metal gate material in the art. The thickness of the metal layer may be from about 5 nm to about 40 nm, and preferably from about 7 nm to about 20 nm, although lesser and greater thicknesses are also contemplated herein. The composition of the metal layer may be selected to optimize performance of semiconductor devices such as a threshold voltage of a transistor employing a metal gate. If a doped semiconductor layer is employed within the gate conductor 72, the doped semiconductor layer includes a polycrystalline semiconductor material having a p-type doping or an n-type doping.

The excess dielectric material of the gate dielectric 70, in case the material of the gate dielectric 70 is formed by deposition, and the excess conductive material of the gate conductor 72 above the top surface of the dielectric material layer 62 is removed, for example, by a recess etch, chemical mechanical planarization (CMP), or a combination thereof. After planarization, the top surface of the gate conductor 72 is coplanar with the top surfaces of the dielectric gate spacer 40 and the dielectric material layer 62. Further, if the gate dielectric 72 is a U-shaped dielectric that extends to the top surface of the gate conductor 72, the top surface of the gate dielectric 72 is also coplanar with the top surfaces of the dielectric gate spacer 40 and the dielectric material layer 62. The gate dielectric 70 and the gate conductor 72 constitute the replacement gate stack (70, 72). The thickness of the dielectric material layer 62 can be from 50 nm to 500 nm, and typically from 80 nm to 250 nm, although lesser and greater thicknesses can also be employed.

Figure 6:
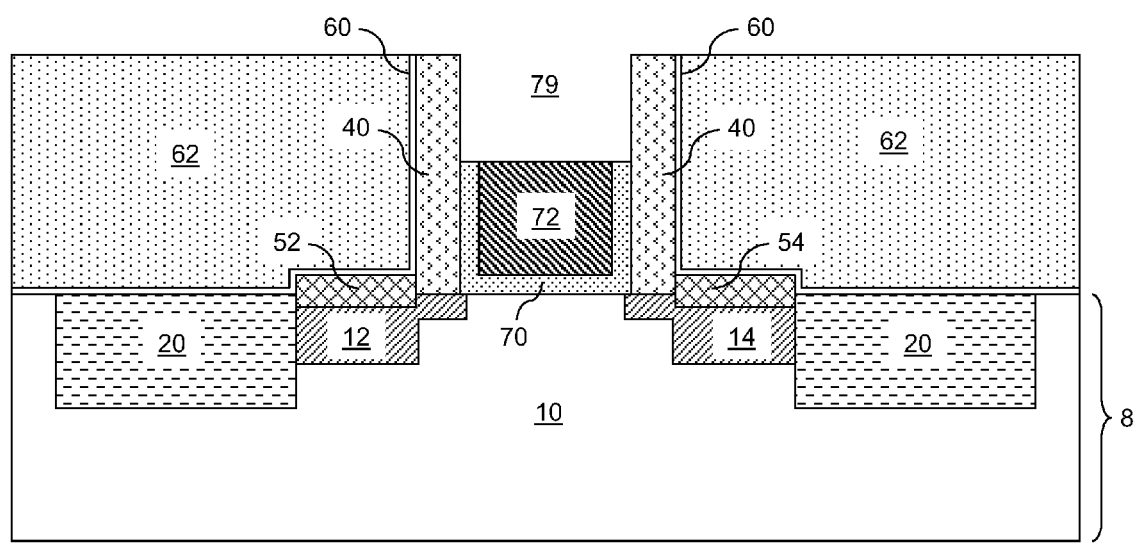
FIG. 6 is a vertical cross-sectional view of the first exemplary semiconductor structure after recessing of the replacement gate stack according to the first embodiment of the present invention.

Referring to FIG. 6, the replacement gate stack (70, 72) is recessed relative to the top surface of the dielectric material layer 62 to form a recessed space 79. An anisotropic or isotropic etch that is selective to the dielectric material layer 62 and the dielectric gate spacer 40 can be employed. The depth of the recessed space 79 can be from 25 nm to 250 nm, and typically from 30 nm to 100 nm, although lesser and greater thicknesses can also be employed.

Figure 7:
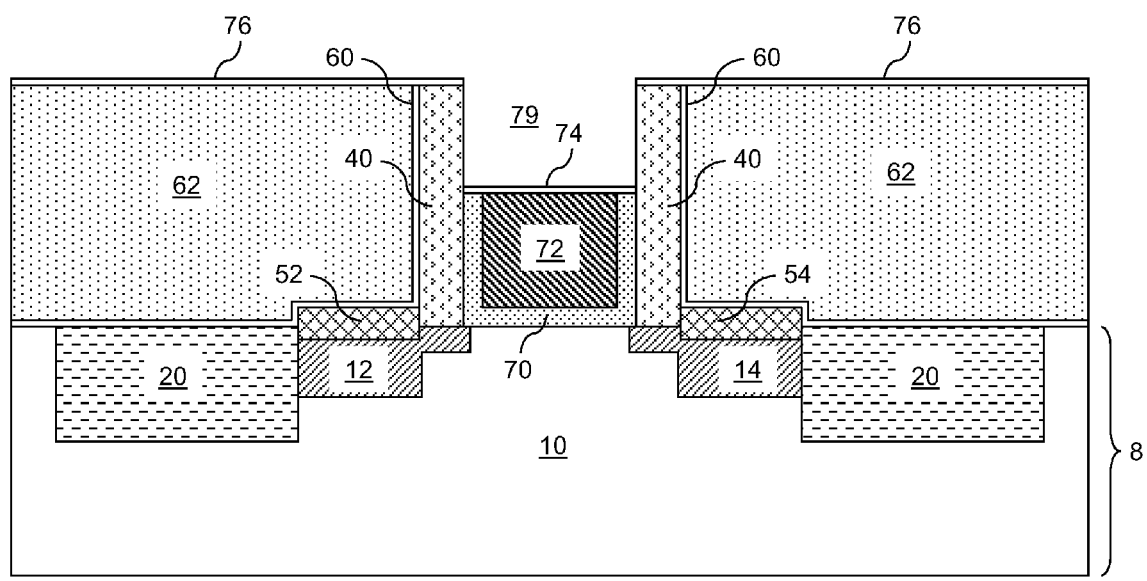
FIG. 7 is a vertical cross-sectional view of the first exemplary semiconductor structure after formation of a dielectric metal oxide layer according to the first embodiment of the present invention.

Referring to FIG. 7, a dielectric metal oxide material can be deposited by a non-conformal deposition to form a dielectric metal oxide layer 76 on top surfaces of the dielectric material layer 62 and the dielectric gate spacer 40 and to form a dielectric metal oxide cap 74 on the top surface of the replacement gate stack (70, 72). The dielectric metal oxide layer 76 can be composed of a high dielectric constant (high-k) dielectric material that can be employed for the gate dielectric 70. The dielectric metal oxide layer 76 includes a metal and oxygen, and optionally nitrogen. The dielectric metal oxide layer 76 can be formed by non-conformal deposition methods well known in the art including, for example, a non-conformal chemical vapor deposition (CVD), molecular beam epitaxy (MBE), pulsed laser deposition (PLD), liquid source misted chemical deposition (LSMCD), etc. The thickness of the dielectric metal oxide layer 76 can be from about 1 nm to about 5 nm, although lesser and greater thicknesses can also be employed.

In alternate embodiments, the removal of an upper portion of the replacement gate stack (70, 72) and the upper portion of the dielectric gate spacer 40 can be effected simultaneously, or in reverse order, i.e., the upper portion of the dielectric gate spacer 40 can be removed prior to removal of the upper portion of the replacement gate stack (70, 72).

Figure 8:
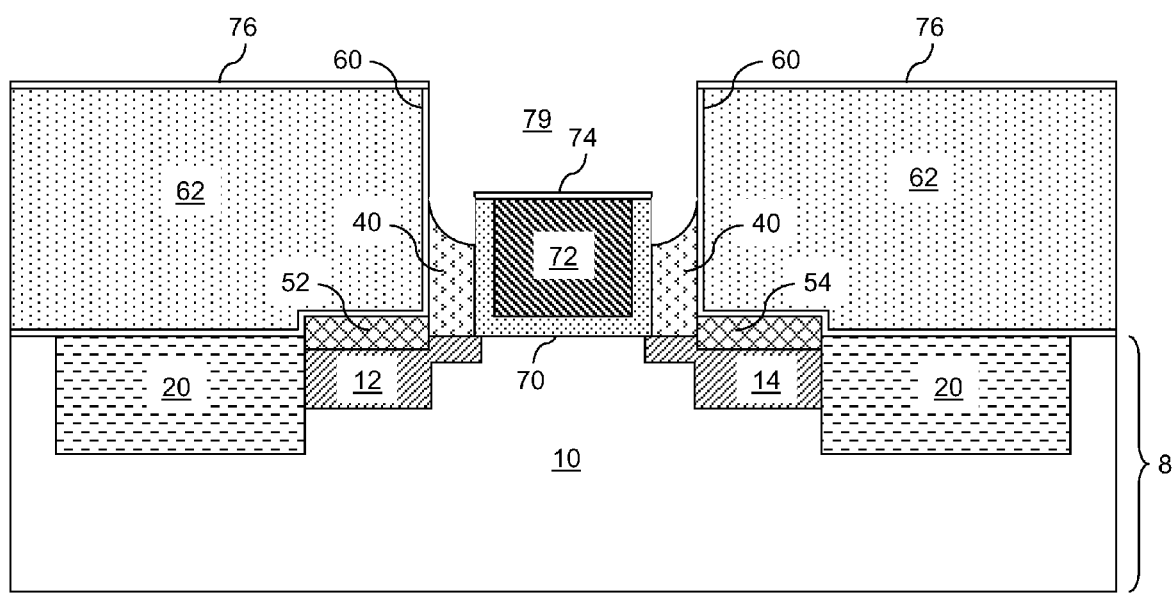
FIG. 8 is a vertical cross-sectional view of the first exemplary semiconductor structure after etching exposed portions of the dielectric gate spacer according to the first embodiment of the present invention.

Referring to FIG. 8, the recessed space 79 is laterally expanded by etching exposed portions of the dielectric gate spacer 40. Because the dielectric metal oxide layer 76 is non-conformally deposited, the amount of the deposited dielectric metal oxide material on inner sidewalls of the dielectric gate spacer 40 is insignificant. Thus, an etchant removes the material of the dielectric gate spacer 40 from the exposed inner sidewalls of the dielectric gate spacer 40. Preferably, the etch is an isotropic etch. The etchant can be a gas phase etchant provided in a chamber or a liquid phase etchant provided in a tank. In one embodiment, the etch is selective to the material of the dielectric metal oxide cap 74 and the dielectric metal oxide layer 76.

In one embodiment, the etch proceeds to expose the vertical portions of the optional dielectric liner 60, which preferably includes a material that is different from the material of the dielectric gate spacer 40 and is resistant to the etchant. Because the dielectric metal oxide layer 76 is too thin to provide self-sufficient mechanical support, the overhanging portions of the dielectric metal oxide layer 76 can be broken off during the etch. At the end of the etch, the recessed space laterally extends from a sidewall of a first vertical portion of the optional dielectric liner 60 to a sidewall of a second vertical portion of the optional dielectric liner 60, or from a first sidewall of the dielectric material layer 62 to a second sidewall of the dielectric material layer 62 if the optional dielectric liner 60 is not present. If an isotropic etch is employed to expand the recessed space 79, the upper surfaces of the remaining portions of the dielectric gate spacer can be concave and face inward, i.e., face toward the replacement gate stack (70, 72).

Figure 9:
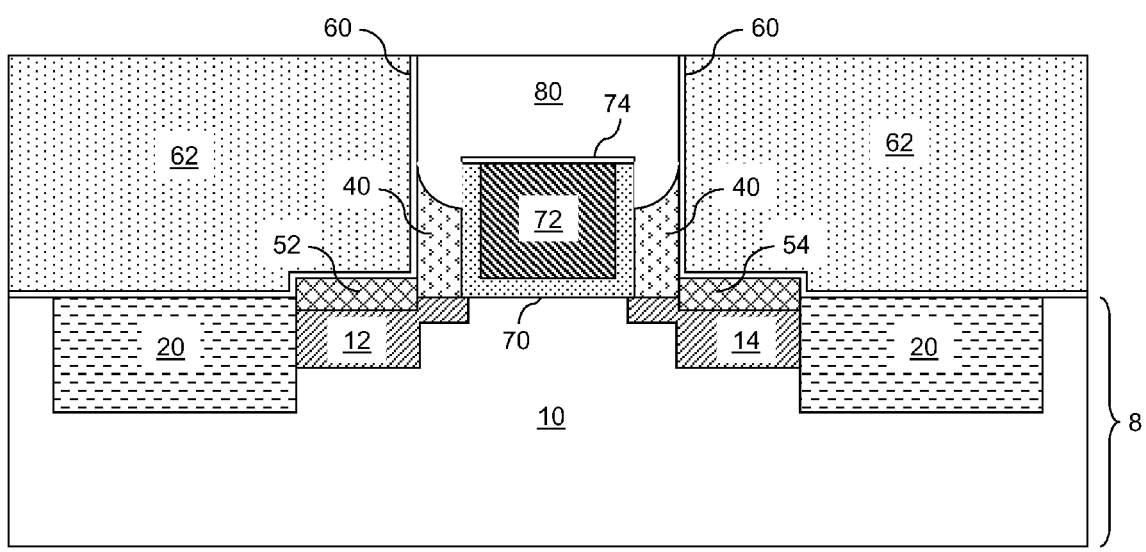
FIG. 9 is a vertical cross-sectional view of the first exemplary semiconductor structure after formation of a dielectric gate cap according to the first embodiment of the present invention.

Referring to FIG. 9, a dielectric gate cap 80 is formed by filling the recessed space 79 with a dielectric material 80. The material of the dielectric gate cap 80 is different from the material of the dielectric material layer 62. Specifically, the material of the dielectric gate cap 80 is selected so that an etch process can remove the material of the dielectric material layer 62 at a higher etch rate than the material of the dielectric gate cap 80. For example, the dielectric material layer 62 can be composed of an organosilicate glass (OSG), and the dielectric gate cap 80 can be composed of silicon oxide or silicon nitride. Alternately, the dielectric material layer 62 can be composed of a doped silicate glass having a high etch rate (such as borosilicate glass or fluorosilicate glass), and the dielectric gate cap 80 can be composed of undoped silicate glass, silicon nitride, or a combination thereof. Yet alternately, the dielectric material layer 62 can be composed of silicon oxide, and the dielectric gate cap 80 can be composed of silicon nitride.

The excess dielectric material deposited over the top surface of the dielectric material layer to fill the recessed space 79 is removed, for example, by a recess etch, chemical mechanical planarization (CMP), or a combination thereof. The remaining portion of the dielectric material after planarization constitutes the dielectric gate cap 80. The top surface of the dielectric gate cap 80 is coplanar with the top surface of the dielectric material layer 62. If the optional dielectric liner 60 is present, the sidewalls of the dielectric gate cap 80 contacts the inner sidewalls of vertical portions of the optional dielectric liner 60, and the sidewalls of the dielectric material layer 62 contact outer sidewalls of the vertical portions of the optional dielectric liner 60. If the optional dielectric liner 60 is not present, the sidewalls of the dielectric gate cap 80 contacts sidewalls of the dielectric material layer 62. The dielectric gate cap 80 located above the gate conductor 72 and contacting upper surfaces of the dielectric gate spacer 40. If the upper surfaces of the dielectric gate spacer 40 are concave and face inward, a peripheral bottom portion of the dielectric gate cap 80 extends downward below the top surface of the gate conductor 72 and has a convex bottom surface that face outward. The outer sidewalls of the dielectric gate spacer 40 are vertically coincident with sidewalls of the dielectric gate cap 60.

Figure 10:
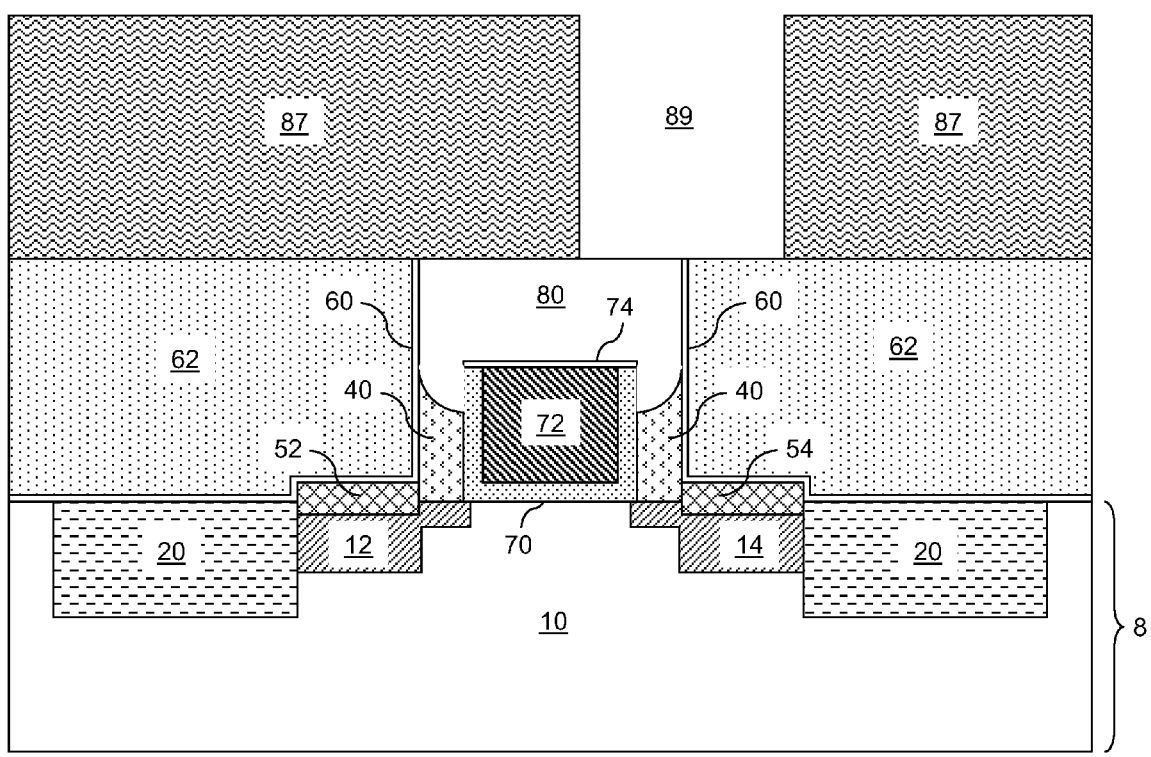
FIG. 10 is a vertical cross-sectional view of the first exemplary semiconductor structure after application and patterning of a masking layer according to the first embodiment of the present invention.

Referring to FIG. 10, a masking layer 87 is applied to the top surfaces of the dielectric material layer 62 and the dielectric gate cap 80. The masking layer 87 is subsequently lithographically patterned to form an opening therein. Specifically, the opening 89 is located above the drain-side metal semiconductor alloy portion, an adjoining portion of the optional dielectric liner 60, and a portion of the dielectric gate spacer 40. The opening 89 may overlie less than the full width of a drain-side portion of the dielectric gate spacer 40, the full width of the drain-side portion of the dielectric gate spacer 40, or more than the full width of the drain-side portion of the dielectric gate spacer 40. Further, the opening 89 may overlie a portion of the replacement gate stack (70, 72). In case the gate dielectric 70 is U-shaped, the opening 89 may overlie only a portion of the gate dielectric 70, or may overlie a portion of the gate dielectric 70 and a portion of the gate conductor 72.

In one embodiment, the masking layer 87 is a photoresist layer, and the opening 89 is lithographically patterned by lithographic exposure and development of the photoresist layer. In another embodiment, the masking layer 87 is a dielectric material layer, and can be patterned by application of a photoresist layer (not shown) thereupon, lithographic exposure and development of the photoresist layer, transfer of the pattern in the photoresist layer into the masking layer 87 by an etch such as an anisotropic reactive ion etch, and removal of the photoresist layer.

Figure 11:
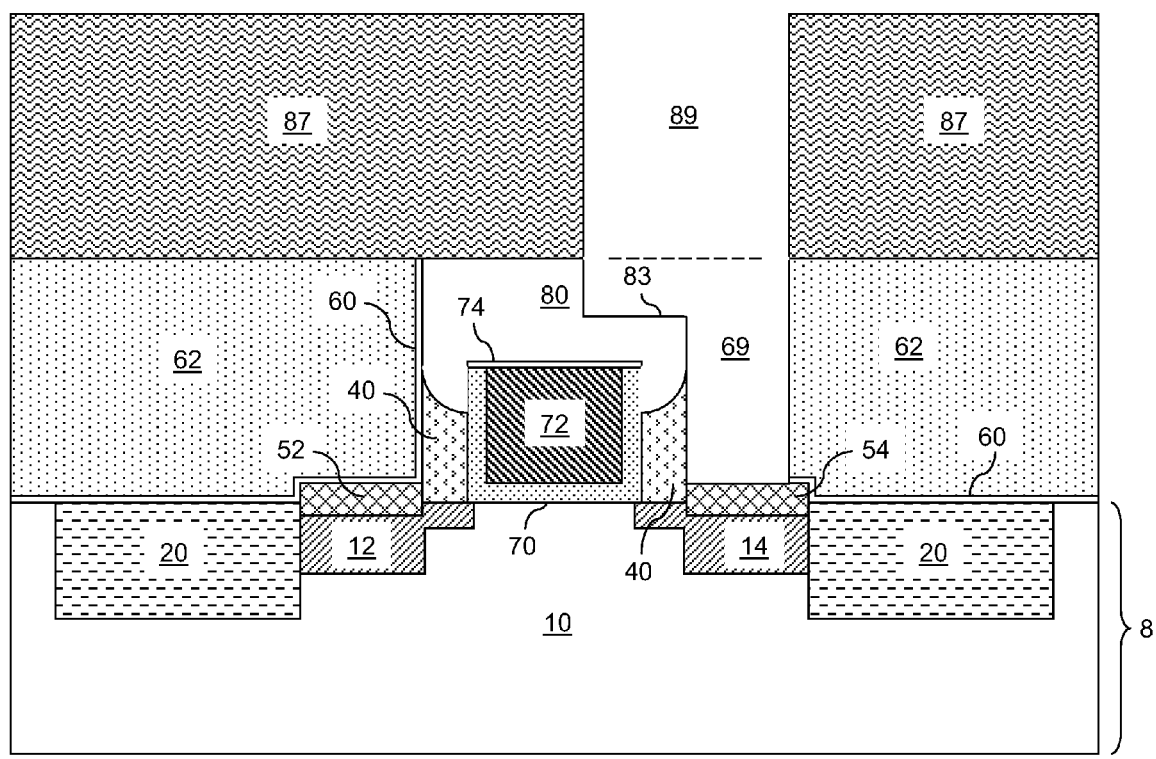
FIG. 11 is a vertical cross-sectional view of the first exemplary semiconductor structure after formation of a contiguous via cavity according to the first embodiment of the present invention.

Referring to FIG. 11, a contiguous via cavity 69 is formed by vertically transferring the pattern in the opening 89 into the dielectric material layer 62 and the dielectric gate cap 80. The pattern transfer can be effected by anisotropically etching exposed portions of the dielectric material layer 62, the dielectric gate cap 80, and the optional dielectric liner 60. A contiguous via cavity 69 is formed between the top surface of the dielectric material layer 62 and the drain-side metal semiconductor alloy portion 54. A top surface of the drain-side metal semiconductor alloy portion 54 is exposed at the bottom of the contiguous via cavity 69.

The etch chemistry of the anisotropic etch employed to form the contiguous via cavity 69 is selected to provide a higher etch rate for the material of the dielectric material layer 62 than for the material of the dielectric gate cap 80. The ratio of the etch rate for the material of the dielectric material layer 62 to the etch rate for the material of the dielectric gate cap 80 is preferably greater than 2.0, and more preferably greater than 3.0, and even more preferably greater than 6.0. Preferably, the anisotropic etch terminates upon exposure of the top surface of the drain-side metal semiconductor alloy portion 54. A recessed horizontal surface 83 of the dielectric gate cap 80 is formed between the top surface of the dielectric gate cap 80 and the dielectric metal oxide cap 74. The recessed horizontal surface 83 is recessed relative to the topmost surface of the dielectric gate cap 80. After the anisotropic etch, the contiguous via cavity 69 includes a laterally protruding portion that overlies the recessed horizontal surface 83 of the dielectric gate cap 80. In one embodiment, the laterally protruding portion overlies a portion of the gate dielectric 70 and/or a portion of the gate conductor 72. Further, a vertical sidewall of the dielectric gate cap 80 is exposed between the recessed horizontal surface 83 and the topmost surface of the dielectric gate cap 80 at an end of the laterally protruding portion, and another vertical sidewall extending between the top surface of the dielectric material layer 62 and the top surface of the drain-side metal semiconductor alloy portion 54 is exposed on the opposite side of the laterally protruding portion of the contiguous via cavity 69.

Figure 12:
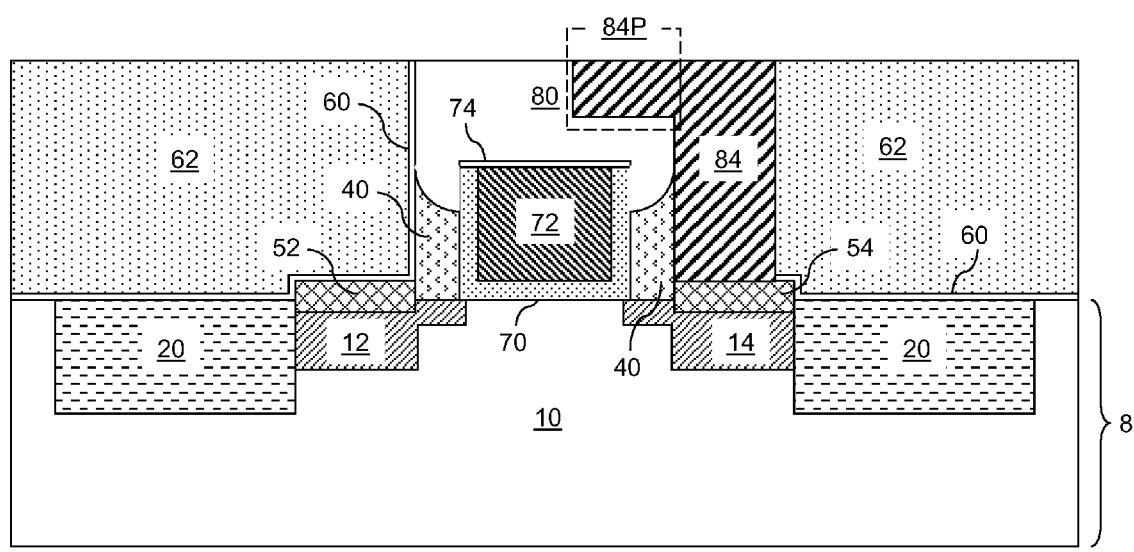
FIG. 12 is a vertical cross-sectional view of the first exemplary semiconductor structure after formation of a conductive via structure according to the first embodiment of the present invention.

Referring to FIG. 12, the masking layer 87 is removed selective to the dielectric material layer 62. A conductive material is deposited to fill the contiguous via cavity 69, and is subsequently planarized. In one embodiment, the conductive via structure 84 is composed of a metallic material such as W, Al, Cu, Al, TaN, TiN, WN, or a combination thereof. In another embodiment, the conductive via structure 84 is composed of a doped semiconductor material such as doped polysilicon or a doped silicon-containing semiconductor material. The material of the conductor via structure 84 can be deposited, for example, by chemical vapor deposition (CVD), physical vapor deposition (PVD), electroplating, electroless plating, or a combination thereof.

During the planarization process, excess portions of the conductive material above the top surface of the dielectric material layer 62 are removed, for example, by a recess etch, chemical mechanical planarization, or a combination thereof. The remaining portion of the conductive material within the contiguous via cavity 69 constitutes a conductive via structure 84. The top surface of the contact via structure 84 is coplanar with the top surface of the dielectric material layer 62.

The conductive via structure 84 has a sidewall that contacts the dielectric gate spacer 40 and the dielectric gate cap 80. The conductive via structure 84 includes an upper conductive via portion 84P that laterally protrudes above this sidewall of the conductive via structure and over a portion of the dielectric gate spacer 40. The upper conductive via portion 84P has a horizontal bottom surface that contacts a horizontal surface, i.e., the recessed horizontal surface 83 in FIG. 11, of the dielectric gate cap 80. The upper conductive via portion 84P has a horizontal top surface that is coplanar with the topmost surface of the dielectric gate cap 80. In one embodiment, the upper conductive via portion 84P overlies a portion of the gate dielectric 70 and/or a portion of the gate conductor 72. A vertical sidewall of the conductive via structure 84 extends from the horizontal top surface of the conductive via structure 84 to the top surface of the drain-side metal semiconductor alloy 14 that is located on the drain region 14 of the field effect transistor.

Alternately, the contiguous via cavity 69 and the conductive via structure 84 can be formed on the source side instead of the drain side. In this case, a vertical sidewall of the conductive via structure 84 extends from the horizontal top surface of the conductive via structure 84 to the top surface of the source-side metal semiconductor alloy 12 that is located on the source region 12 of the field effect transistor.

Figure 13:
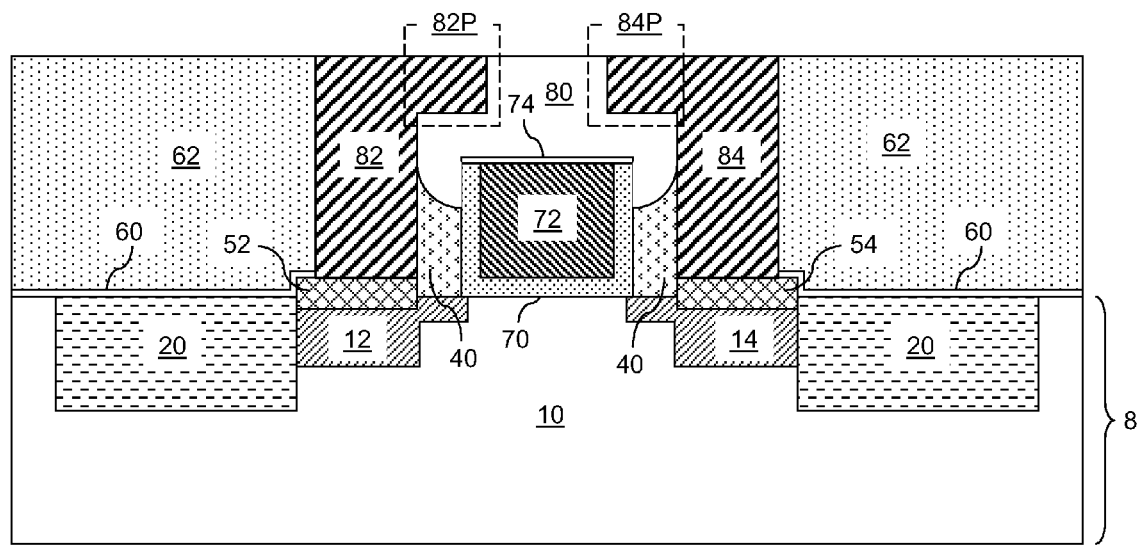
FIG. 13 is a vertical cross-sectional view of a variation of the first exemplary semiconductor structure after formation of two conductive via structures according to the first embodiment of the present invention.

Referring to FIG. 13, a variation of the first exemplary semiconductor includes two conductive via structures (84, 82), i.e., a first conductive via structure 84 and a second conductive via structure 82. The first and second conductive via structures (84, 82) can be formed by forming two openings in the masking layer 87 at a processing step of FIG. 10. A first opening is formed in an area overlying a portion of the drain-side metal semiconductor alloy portion 54 and a first edge portion of the dielectric gate cap 80, and a second opening is formed in an area overlying a portion of the source-side metal semiconductor alloy portion 52 and a second edge portion of the dielectric gate cap 80.

Processing steps of FIGS. 11 and 12 are employed to form the first and second conductive via structures (84, 82). Each conductive via structure (84, 82) has a sidewall that contacts the dielectric gate spacer 40 and the dielectric gate cap 80. Each conductive via structure (84, 82) includes an upper conductive via portion (84P or 82P) that laterally protrudes above that sidewall of the conductive via structure (84, 82) and over a portion of the dielectric gate spacer 40. The first and second conductive via structures (84, 82) are located on opposite sides of the gate conductor 72.

Figure 14:
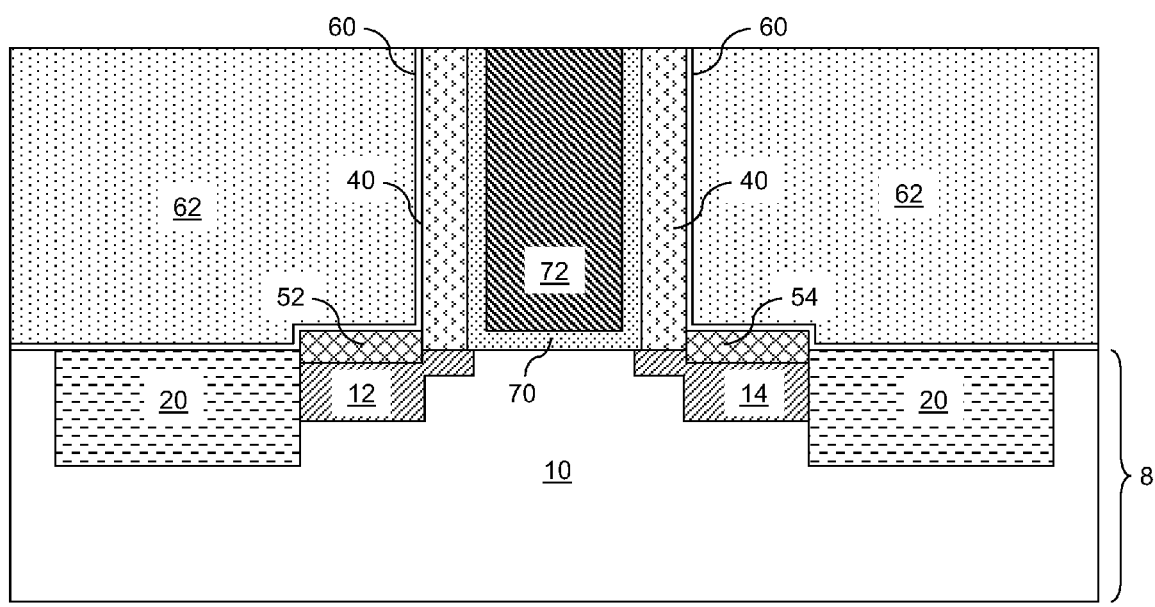
FIG. 14 is a vertical cross-sectional view of a second exemplary semiconductor structure after formation of a replacement gate stack according to a second embodiment of the present invention.

Referring to FIG. 14, a second exemplary semiconductor structure according to a second embodiment of the present invention is derived from the first exemplary semiconductor structure of FIG. 2 by employing the same processing steps employed in FIG. 3 of the first embodiment. Compared to the first exemplary semiconductor structure, the thickness, i.e., the vertical dimension, of the dielectric material layer 62 and the height, i.e., the vertical dimension, of the dielectric gate spacer 40 can be increased to compensate for a reduction of the thickness of the dielectric material layer 62 in subsequent processing steps. For example, the thickness of the dielectric material layer 62 can be from 100 nm to 600 nm, and typically from 120 nm to 300 nm, although lesser and greater thicknesses can also be employed.

Figure 15:
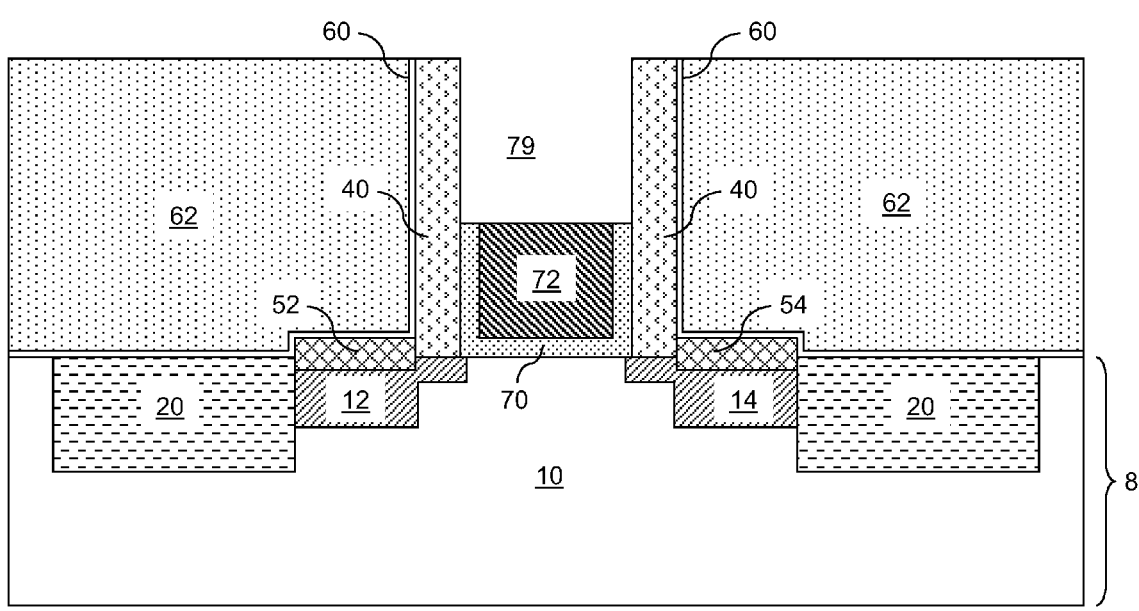
FIG. 15 is a vertical cross-sectional view of the second exemplary semiconductor structure after recessing of the replacement gate stack according to the second embodiment of the present invention.

Referring to FIG. 15, processing steps of FIG. 6 is performed to vertically recess the replacement gate stack (70, 72). The depth of the recessed space 79 can be from 50 nm to 300 nm, and typically from 60 nm to 150 nm, although lesser and greater thicknesses can also be employed.

Figure 16:
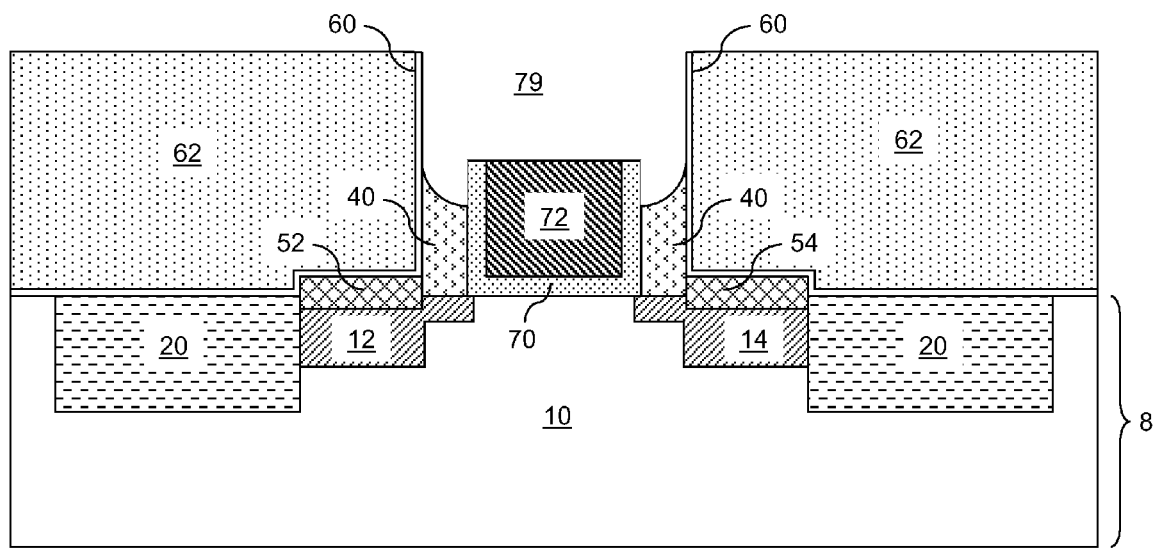
FIG. 16 is a vertical cross-sectional view of the second exemplary semiconductor structure after etching exposed portions of the dielectric gate spacer according to the second embodiment of the present invention.

Referring to FIG. 16, the recessed space 79 is laterally expanded by etching exposed portions of the dielectric gate spacer 40 employing the same methods as in FIG. 8 of the first embodiment. Compared to the first embodiment, the second embodiment does not form a dielectric metal oxide layer or a dielectric metal oxide cap. An etchant removes the material of the dielectric gate spacer 40 from the exposed inner sidewalls of the dielectric gate spacer 40. Further, the etchant removes the material of the dielectric material layer 62 from above, thereby reducing the thickness of the dielectric material layer 62. In one embodiment, the etchant is selected to minimize the etching of the dielectric material layer 62, while providing sufficient etching of the dielectric gate spacer 40. The etch rate of the dielectric material layer 62 can be less than, or on par with, the etch rate of the dielectric gate spacer 40. For example, if the dielectric gate spacer 40 is silicon nitride and the dielectric material layer 62 is silicon oxide, a chemical that etches silicon nitride selective to silicon oxide can be employed. Alternately, the dielectric gate spacer 40 and the dielectric material layer 62 are composed of the same dielectric material such as silicon oxide. In this case, the dielectric gate spacer 40 and the dielectric material layer 62 can be etched at the same etch rate. The etchant can be a gas phase etchant provided in a chamber or a liquid phase etchant provided in a tank. The thickness of the dielectric material layer 62 after the etch can be from 50 nm to 500 nm, and typically from 80 nm to 250 nm, although lesser and greater thicknesses can also be employed.

In one embodiment, the etch proceeds to expose the vertical portions of the optional dielectric liner 60, which preferably includes a material that is different from the material of the dielectric gate spacer 40 and is resistant to the etchant. At the end of the etch, the recessed space laterally extends from a sidewall of a first vertical portion of the optional dielectric liner 60 to a sidewall of a second vertical portion of the optional dielectric liner 60, or from a first sidewall of the dielectric material layer 62 to a second sidewall of the dielectric material layer 62 if the optional dielectric liner 60 is not present. If an isotropic etch is employed to expand the recessed space 79, the upper surfaces of the remaining portions of the dielectric gate spacer can be concave and face inward, i.e., face toward the replacement gate stack (70, 72).

Figure 17:
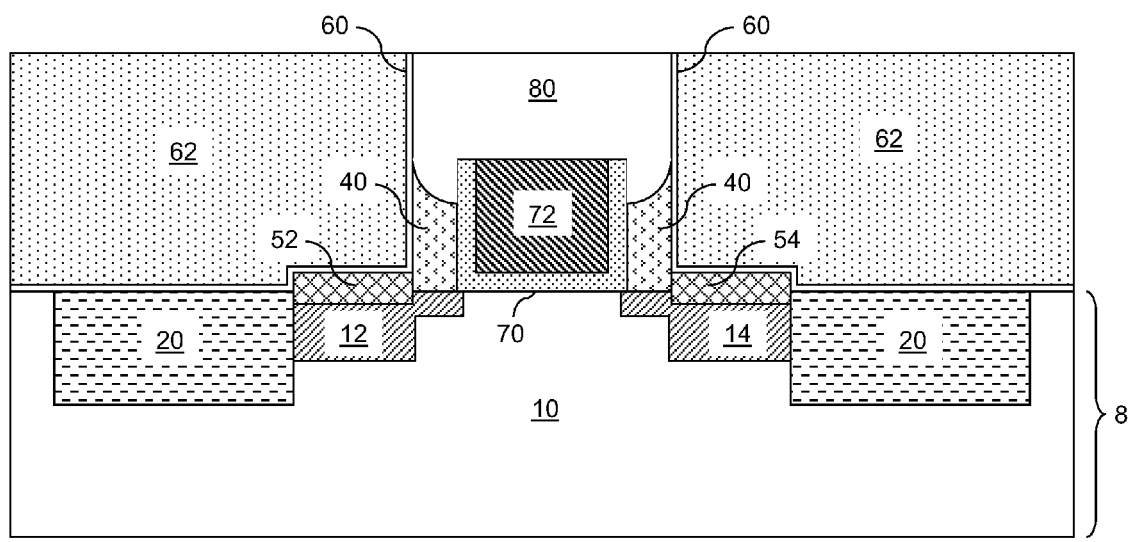
FIG. 17 is a vertical cross-sectional view of the second exemplary semiconductor structure after formation of a dielectric gate cap according to the second embodiment of the present invention.

Referring to FIG. 17, a dielectric gate cap 80 is formed by filling the recessed space 79 with a dielectric material 80 employing the same processing steps as in FIG. 9 of the first embodiment. The material of the dielectric gate cap 80 is different from the material of the dielectric material layer 62. Specifically, the material of the dielectric gate cap 80 is selected so that an etch process can remove the material of the dielectric material layer 62 at a higher etch rate than the material of the dielectric gate cap 80. The excess dielectric material deposited over the top surface of the dielectric material layer to fill the recessed space 79 is removed, for example, by a recess etch, chemical mechanical planarization (CMP), or a combination thereof. The remaining portion of the dielectric material after planarization constitutes the dielectric gate cap 80. The top surface of the dielectric gate cap 80 is coplanar with the top surface of the dielectric material layer 62.

Figure 18:
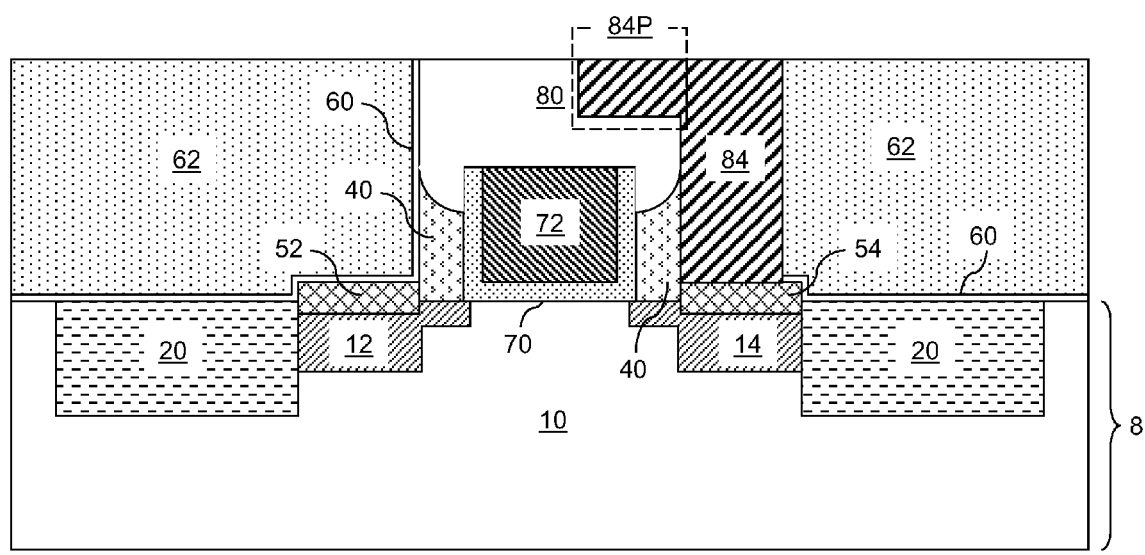
FIG. 18 is a vertical cross-sectional view of the second exemplary semiconductor structure after formation of a conductive via structure according to the second embodiment of the present invention.

Referring to FIG. 18, processing steps of FIGS. 10, 11, and 12 of the first embodiment are employed to form a conductive via structure 84 having the same compositional and geometrical features as in the first embodiment.

Figure 19:
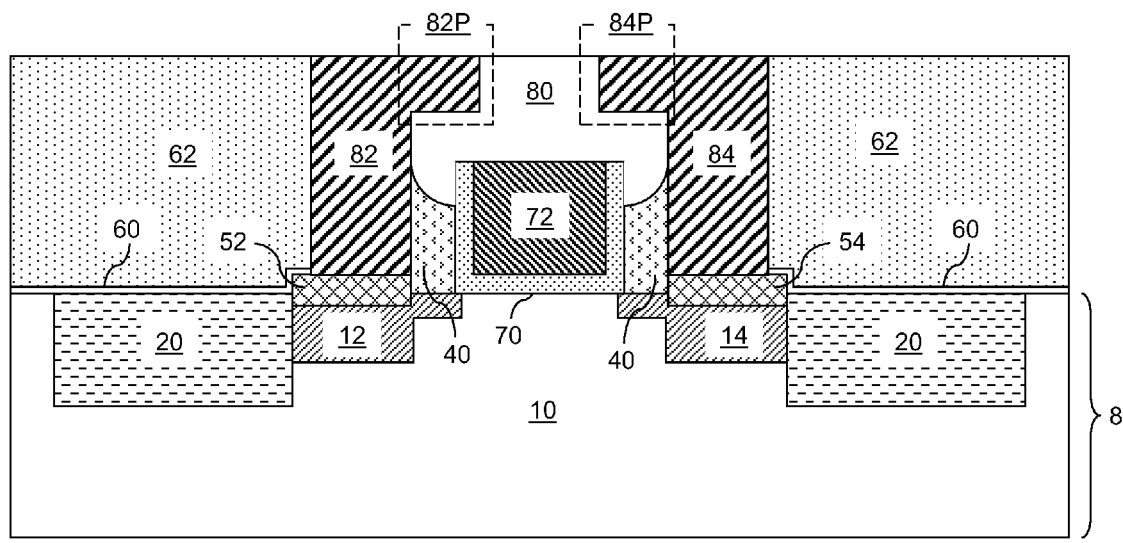
FIG. 19 is a vertical cross-sectional view of a variation of the second exemplary semiconductor structure after formation of two conductive via structures according to the second embodiment of the present invention.

Referring to FIG. 19, a variation of the second exemplary semiconductor structure can be derived from the second exemplary semiconductor structure of FIG. 17 by forming two conductive via structures (84, 82) as in the variation of the first embodiment shown in FIG. 13.

While the invention has been described in terms of specific embodiments, it is evident in view of the foregoing description that numerous alternatives, modifications and variations will be apparent to those skilled in the art. For example, though the present invention is described with exemplary structures including a field effect transistor and an antifuse structure, the present invention may be practiced without any field effect transistor. Accordingly, the invention is intended to encompass all such alternatives, modifications and variations which fall within the scope and spirit of the invention and the following claims.

What is claimed is:

1. A semiconductor structure comprising:
a field effect transistor including a gate stack, from bottom to top, of a gate dielectric and a gate conductor, wherein said gate stack is located on a surface of a semiconductor substrate;
a dielectric gate spacer located on a side surface of said gate stack, wherein the dielectric gate spacer has a concave upper surface relative to the base of the dielectric gate spacer;
a dielectric gate cap located above said gate stack and contacting said concave upper surface of said dielectric gate spacer on the side surface of the gate stack, the dielectric gate cap having a notch portion extending into the sidewall of the dielectric gate cap that is overlying the dielectric gate spacer; and
a conductive via structure having a sidewall that contacts said dielectric gate spacer and said dielectric gate cap and including an upper conductive via portion that laterally protrudes into the notch portion of the dielectric gate cap and over a portion of said dielectric gate spacer.

2. The semiconductor structure of claim 1, wherein said upper conductive via portion has a horizontal bottom surface that contacts a horizontal surface of said dielectric gate cap.

3. The semiconductor structure of claim 1, wherein said upper conductive via portion overlies a portion of said gate dielectric.

4. The semiconductor structure of claim 1, wherein said upper conductive via portion overlies a portion of said gate conductor.

5. The semiconductor structure of claim 1, wherein outer sidewalls of said dielectric gate spacer are vertically coincident with lower portions of sidewalls of said dielectric gate cap.

6. The semiconductor structure of claim 1, wherein said field effect transistor includes a metal semiconductor alloy portion located directly on a source region or a drain region of said field effect transistor, wherein a bottom surface of said conductive via structure contacts said metal semiconductor alloy portion.

7. The semiconductor structure of claim 1, wherein said gate dielectric is a U-shaped gate dielectric comprising a dielectric metal oxide having a dielectric constant greater than 4.0.

8. The semiconductor structure of claim 1, further comprising a dielectric material layer located above said surface of said semiconductor substrate, wherein a top surface of said dielectric material layer is coplanar with a horizontal topmost surface of said dielectric gate cap.

9. The semiconductor structure of claim 8, wherein said upper conductive via portion has a horizontal top surface that is coplanar with said topmost surface of said dielectric gate cap.

10. The semiconductor structure of claim 9, wherein a vertical sidewall of said conductive via structure extends from said horizontal top surface to a top surface of a metal semiconductor alloy located on a source region or a drain region of said field effect transistor.

11. The semiconductor structure of claim 8, further comprising a dielectric liner located on said surface of said semiconductor substrate and including a vertical portion that contiguously extends to said top surface of said dielectric material layer.

12. The semiconductor structure of claim 1, further comprising another conductive via structure having another sidewall that contacts said dielectric gate spacer and said dielectric gate cap and including another upper conductive via portion that laterally protrudes over another portion of said dielectric gate spacer, wherein said another portion of said dielectric gate spacer and said portion of said dielectric gate spacer are located on opposite sides of said gate conductor.

13. A semiconductor structure comprising:
a field effect transistor including a gate stack, from bottom to top, of a gate dielectric and a gate conductor, wherein said gate stack is located on a surface of a semiconductor substrate;
a dielectric gate spacer located on a surface of said gate dielectric;
a dielectric gate cap located above said gate stack and contacting upper surfaces of said dielectric gate spacer; and
a conductive via structure having a sidewall that contacts said dielectric gate spacer and said dielectric gate cap and including an upper conductive via portion that laterally protrudes above said sidewall of said conductive via structure and over a portion of said dielectric gate spacer, wherein said upper conductive via portion has a horizontal top surface that is coplanar with a topmost surface of said dielectric gate cap.

14. A method of forming a semiconductor structure comprising:
forming a disposable material stack on a surface of said semiconductor substrate;
forming a dielectric gate spacer on sidewalls of said disposable material stack;
forming a dielectric material layer on said surface of said semiconductor substrate, wherein said dielectric gate spacer has inner vertical sidewalls and outer vertical sidewalls, each of which extending from said surface of said semiconductor substrate to a top surface of said dielectric material layer;
forming a gate dielectric and a gate conductor on said semiconductor substrate by replacing said disposable material stack;
forming a recessed space by recessing said gate conductor and said dielectric gate spacer;
forming a dielectric gate cap by filling said recessed space, wherein a topmost surface of said dielectric gate cap is coplanar with a topmost surface of said dielectric material layer after planarization; and
anisotropically etching a portion of said dielectric material layer and an upper portion of said dielectric gate spacer, wherein a contiguous via cavity exposing a conductive structure underneath said dielectric material layer is formed, and said contiguous via cavity includes a laterally protruding portion that overlies a horizontal surface of said dielectric gate cap that is recessed relative to said topmost surface of said dielectric gate cap.

15. The method of claim 14, further comprising forming a contact via structure in said contiguous via cavity by filling said contiguous via cavity with a conductive material and planarizing said conductive material, wherein a top surface of said contact via structure is coplanar with said top surface of said dielectric material layer.

16. The method of claim 15, wherein said conductive structure is a metal semiconductor alloy portion located on a source region or a drain region of a field effect transistor including said gate dielectric and said gate conductor.

17. The method of claim 14, wherein said anisotropically etching etches a material of said dielectric material layer faster than a material of said dielectric gate cap.

18. The method of claim 14, wherein said dielectric gate spacer is formed directly on said disposable material stack, and said method further comprises removing said disposable material stack selective to said dielectric gate spacer and said dielectric material layer, wherein a vacant space exposing a portion of said top surface of said semiconductor substrate is formed after removal of said disposable material stack, and said gate dielectric and said gate conductor are subsequently formed by filling said vacant space.

19. The method of claim 18, wherein a top surface of said gate conductor is coplanar with said top surface of said dielectric material layer before forming said a recessed space.

20. The method of claim 19, wherein said gate dielectric is a U-shaped gate dielectric comprising a dielectric metal oxide having a dielectric constant greater than 4.0 and contiguously extending from said top surface of said semiconductor substrate to said top surface of said dielectric material layer.

* * * * *